United States Patent [19]
Barr et al.

[11] Patent Number: 6,004,725
[45] Date of Patent: Dec. 21, 1999

[54] PHOTOIMAGEABLE COMPOSITIONS

[75] Inventors: Robert Barr, Laguna Niguel; Daniel E. Lundy, Pomona, both of Calif.; Eiji Kosaka; Shigeru Murakami, both of Gifu Prefecture, Japan

[73] Assignee: Morton International, Inc., Chicago, Ill.

[21] Appl. No.: 09/118,626

[22] Filed: Jul. 17, 1998

Related U.S. Application Data

[63] Continuation-in-part of application No. 08/982,199, Dec. 1, 1997, and a continuation-in-part of application No. 08/980,686, Dec. 1, 1997, abandoned, and a continuation-in-part of application No. 09/088,561, Jun. 2, 1998, Pat. No. 5,939,238.

[51] Int. Cl.$^6$ ............................... G03F 7/31; G03F 0/33
[52] U.S. Cl. ................. 430/284.1; 522/28; 430/912; 430/910; 430/259; 430/260
[58] Field of Search ................. 430/284.1, 912, 430/910, 259, 260; 522/28

[56] References Cited

U.S. PATENT DOCUMENTS

| | | | |
|---|---|---|---|
| 4,539,286 | 9/1985 | Lipson et al. | 430/277.1 |
| 4,705,740 | 11/1987 | Geissler et al. | 430/288.1 |
| 4,885,229 | 12/1989 | Takenaka et al. | 430/285.1 |
| 5,288,589 | 2/1994 | McKeever et al. | 430/262 |
| 5,728,505 | 3/1998 | Dueber et al. | 430/284.1 X |
| 5,744,282 | 4/1998 | Ichikawa et al. | 430/284.1 |
| 5,939,238 | 8/1999 | Barr et al. | 430/281.1 |

FOREIGN PATENT DOCUMENTS

| | | | |
|---|---|---|---|
| 0 738 927 A2 | 10/1996 | European Pat. Off. | 430/284.1 |
| 61-77844 | 4/1986 | Japan . | |

OTHER PUBLICATIONS

Ai et al, 109:83443, English Abstract of Japanese 61–77844 issued on Apr. 21, 1986, Chemical Abstracts, ACS, 2 pages.
Ai et al, 86–141447, WPIDS, Derwent Information Ltd, English Abstract of Japanese 61–77844 issued Apr. 21, 1986.
Ai et al, 61–77844, Patent Abstracts of Japan, English Abstract of Japanese 61–77844 issued Apr. 21, 1986.

*Primary Examiner*—Cynthia Hamilton
*Attorney, Agent, or Firm*—Wayne E. Nacker; Gerald K. White

[57] ABSTRACT

A negative acting photoimageable composition comprises

A) between about 30 and about 70 wt %, based on total weight of A) plus B), of a organic binder polymers having sufficient acid functionality to render said photoimageable composition developable in alkaline aqueous solution,
  A) comprising between about 3 and about 65 wt % relative to total of A) plus B) a binder polymer A') having a weight average molecular weight between about 5000 and about 40,000 and a $T_g$ of between about 40 and about 100, and 5 to 67 wt % relative to total of A) plus B) a binder polymer A") having a weight average molecular weight between about 41,000 and about 200,000 and a $T_g$ of between about 40 and about 100,
B) between about 30 and about 60 wt %, based on total weight of A) plus B), of α,β-ethylenically unsaturated compounds, said component B) comprising
  B') an isocyanate trimer having tri-α,β-ethylenically unsaturated functionality, said trimer B') being present at between about 2 to about 30 wt % based on total weight of A) plus B), and
  B") 0 to about 5 wt % based on total weight of A) plus B) of other α,β-ethylenically unsaturated compounds, at least about 50 mole percent of the α,β-ethylenically unsaturated functionality of B' and B" being methacrylate functionality and
C) between about 0.5 and about 15 wt %, based on total weight of A) plus B) of an organic, radiation-sensitive free-radical generating system, said photoinitiator chemical system C) comprising between about 0.005 and about 3 wt % relative to total weight of A) plus B) of triphenyphosphine and between about 0.005 and about 2 wt % relative to total weight of A) plus B) of n-phenylglycine.

7 Claims, No Drawings

PHOTOIMAGEABLE COMPOSITIONS

This is a continuation-in-part of application Ser. No. 08/982,199, filed Dec. 1, 1997, pending, and a continuation-in-part of application Ser. No. 08/980,686, filed Dec. 1, 1997, now abandoned, and a continuation-in-part of application Ser. No. 09/088,561, filed Jun. 2, 1998, now U.S. Pat. No. 5,939,238.

The present invention is directed to a negative-acting photoimageable composition useful as a photoresist for manufacturing printed circuit boards.

BACKGROUND OF THE INVENTION

This invention is directed to a negative-acting photoimageable composition which is developable in alkaline aqueous solutions. A variety of such photoimageable compositions are described. Essential components of compositions of the type to which the present invention is directed are A) a binder polymer; B) photopolymerizable α,β-ethylenically unsaturated compound(s), and C) a photoinitiator chemical system. The binder polymer A) has sufficient acid functionality, generally carboxylic acid functionality, that it is soluble in alkaline aqueous solution and thereby renders the photoimageable composition developable in alkaline aqueous solutions.

The present invention is directed to a photoimageable composition having improved adhesion and resolution, broad processing latitude, e.g., processed over a broad exposure range, a broad developing range, and good yield.

SUMMARY OF THE INVENTION

The negative-acting photoimageable composition comprises A) between about 30 and about 70 wt %, based on total weight of A) plus B), of a organic binder polymers having sufficient acid functionality to render the photoimageable composition developable in alkaline aqueous solution. The binder polymers A) comprise between about 3 and about 65 wt % relative to total of A) plus B) a binder polymer A') having a weight average molecular weight between about 5000 and about 40,000 and a $T_g$ of between about 40 and about 100° C., and between about 5 and about 67 wt % relative to total of A) plus B) of a binder polymer A") having a weight average molecular weight between about 41,000 and about 200,000 and a $T_g$ of between about 40 and about 100° C. The photoimageable composition further comprises B) between about 30 and about 60 wt %, based on total weight of A) plus B), of α,βethylenically unsaturated compounds. Component B) comprises B') an isocyanate trimer having tri-α,β-ethylenically unsaturated functionality, trimer B') being present at between about 2 to about 30 wt % based on total weight of A) plus B), and B") 0 to about 5 wt % based on total weight of A) plus B) of other α,β-ethylenically unsaturated compounds, at least about 50 mole percent of the α,β-ethylenically unsaturated functionality of B' and B" being methacrylate functionality. The composition further comprises C) between about 0.5 and about 15 wt %, based on total weight of A) plus B) of an organic, radiation-sensitive free-radical generating system, the photoinitiator chemical system C) comprising between about 0.005 and about 3 wt % relative to total weight of A) plus B) of triphenyphosphine and between about 0.005 and about 2 wt % relative to total weight of A) plus B) of n-phenylglycine.

DETAILED DESCRIPTION OF CERTAIN PREFERRED EMBODIMENTS

Herein, unless otherwise noted, all percentages are weight percentages. Component A) (the binder polymers) and Component B) (the photoimageable compounds) are herein considered to equal 100 wt %, and other components, such as the photoinitiator chemical system C), plasticizer, etc. are calculated as parts relative to 100 parts of A) plus B). Molecular weights of polymers and oligomers, unless otherwise stated, are weight average molecular weights.

The invention is directed to photoimageable compositions which are developable in alkaline aqueous solution and which therefore have binder polymer(s) with substantial acid functionality. Herein, the binder polymer component A) comprises a low molecular weight polymer A') and a high molecular weight binder A"), each having substantial acid functionality and each having a glass transition temperature ($T_g$) in the range of 40 to 100° C. The acid numbers of each polymer is at least about 80, preferably at least about 100 and more preferably about 150 or more, up to about 250. The acid functionality is typically carboxylic acid functionality, but may also include, for example, sulfonic acid functionality or phosphoric acid functionality.

The binder polymers A') and A") are each derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, n-butyl acrylate, 2-ethyl hexyl acrylate, n-hexyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimnethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

Examples of such polymers and photoimageable compositions using such polymers are found, in the following U.S. Pat. Nos: 3,953,309, 4,003,877, 4,610,951, and 4,695,527 the teaching of each of which are incorporated herein by reference.

Binder polymer A') of the photoimageable compositions of the present invention has a weight average molecular weight between about 5000 and about 40,000 preferably between about 10,000 and about 30,000. These molecular weights are relatively low for this type of binder polymer; however, the improved adhesion and processing time of the photoimageable composition of the present invention is largely attributable to the utilization of low molecular weight binder polymer. Binder polymer A') is used in admixture with a higher molecular weight binder polymer A"), i.e., a weight average molecular weight between about 41,000 and about 200,000, preferably between about 60,000 and about 120,000 which has a relatively low $T_g$, i.e., between about 40 and about 100. Higher molecular weight binder polymer A") is used to enhance tenting strength.

The photoimageable, acrylate functional, isocyanate trimer B') which comprises a portion of, and in some cases all of, the photopolymerizable component B) has the general formula:

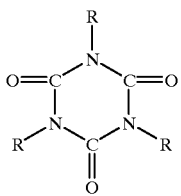

where R is $-(CH_2)_p-NH-COO-(CHY-CHY-O)_m-CO-CX=CH_2$, where X is H or $CH_3$, Y is H, $CH_3$, or $C_2H_5$, is an integer from 1 to 36 and m is an integer from 1 to 14. Such trimers are described in European Patent Application EP 0 738 927 A2.

While the use of low molecular weight binder polymer enhances adhesion and processing time, the short chain polymers tend to reduce overall flexibility of the photoimageable composition. Poor flexibility can cause tented holes to fail and lines to fracture during the many mechanical handling steps, defects which necessitate scrapping printed circuit boards having such defects. The flexibility problem is addressed herein by the use, in conjunction with low molecular weight binder polymers, of the acrylate-functional isocyanate trimer B') (also referred to herein as the "urethane oligomer"). To this end, the molecular weight of the isocyanate trimer should be at least about 1000 and may be as high as about 5000. The relatively high molecular weight of the urethane oligomer B') compensates for the lower molecular weight of the binder polymer, producing a photoimageable composition with flexibility comparable to those formulations using higher molecular weight polymers.

The balance of photopolymerizable component B), used at 0 to about 5 wt % of the photoimageable composition (calculated relative to total weight of A) plus B) is B"), typically a monomer, dimer or short chain oligomer having ethylenic unsaturation, particularly α,β-ethylenic unsaturation, including monofunctional compounds and compounds having α,β-ethylenic unsaturation. Typically, a mixture of mono-functional and multi-functional monomers will be used. Suitable photopolymerizable compounds include, but are not limited to, the monomers recited above as suitable for forming binder polymers, particularly the non-acid functional compounds.

To initiate polymerization of the monomers upon exposure to actinic radiation, the photoimageable composition contains photoinitiator chemical system. At least a part of the photoinitiator chemical system of the present invention comprise a mixture of triphenylphosphine (TPPN) and n-phenylglycine (NPG). This combination is found to produce excellent photospeed without negative impact on adhesion, tenting strength or stability. NPG is used at between about 0.005 and about 3 wt % relative to total of A) plus B) and TPPN is used at between about 0.005 and about 2 wt % relative to total of A) plus B).

In addition to TPPN and NPG, other photoinitiator chemicals may be and typically are included as part of the photoinitiator chemical system. Generally, the photoinitiator chemical system in total comprises between about 0.1 and about 15 wt % based on total weight of A) plus B). Other photoinitiator chemicals include, but are not limited to 9-phenylacridine, aromatic ketones (benzophenone, N,N'-tetramethyl-4,4'-diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoins (benzoin, benzoinmethylether, benzoinethylether, benzoinisopropylether, benzoin-n-butylether, benzoin-phenylether, methylbenzoin, ethybenzoin, etc.), benzyl derivatives (dibenzyl, benzyldiphenyldisulfide, benzyldimethylketal (SIC), etc.), acridine derivatives (9-phenylacridine, 1,7-bis(9-acridinyl) heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (1,1-dichloroacetophenone, p-t-butyldichloroacetophenone, 2,2-diethoxyacetophenone, 2,2-dimethoxy-2-phenylacetophenone, 2,2-dichloro-4-phenoxyacetophenone, etc.), etc. A preferred photoinitiator in addition to TPPN and NPG is 9-phenyl acridine, used at between about 0.05 and about 0.5 wt % relative to total of A) plus B). Also, suitable 9-phenyl acridine homologues, such as those described in U.S. Pat. No. 5,217,845, the teachings of which are incorporated herein by reference, are useful photoinitiators.

It is preferred that the photoinitiator chemical system of the present invention include a lophine dimer (imidazole dimer) at between about 0.5 and about 10 wt % based on total weight of A) plus B). Examples of such lophine dimers include, but are not limited to triphenylbiimidazoles, especially 2,4,5-triphenylimidazole dimers such as 2,2'-bis(o-chlorophenyl)-4,4',5,5'-tetraphenylbiimidazole, 2,2'-bis(o-chlorophenyl)-4,4',5,5'-tetralis(m-methoxyphenyl) biimidazole, 2,2'-bis(p-carboxyphenyl)-4,4',5,5'-tetraphenylbiimidazole, 2,2'-bis(p-chlorophenyl)-4,4',5,5'-tetrakis(p-methoxyphenyl)biimidazole, 2,2'-di-o-tolyl-4,4', 5,5'-tetraphenylbiimidazole, 2,2'-di-p-tolyl-4,4'-di-o-tolyl-5, 5'-diphenylbiimidazole, etc.; these can be used individually or two or more can be used in combination.

In conjunction with the lophine dimer, it is preferred that the composition contain a Leuco dye at between about 0.05 and about 2 wt % relative to A) plus B). The lophine dimer and Leuco dye contribute to through-cure of the exposed photoimageable composition. Suitable Leuco dyes include bischlorimidazole, leuco malachite green, leuco aniline, leuco methyl violet, etc.

As a preferred aspect of the invention, flexibility, is further improved through the use of plasticizers. A preferred plasticizer is para-toluene sulfonamide.

Also useful are dibenzoate plasticizers. Useful dibenzoate plasticizers have the general formula:
$C_6H_5-COO-[R]_n-R'-C_6H_5$, where
R=—$CHX-CHX-O$— where one or both Xs are H or one X may be $CH_3$ and the other H; n=1 to 10, and
R' is —$CH_2-CH(CH_3)-OOC-$, —$CH_2-CH_2-OOC-$, or —$OC-$.
Specific examples of suitable dibenzoates include, but are not limited to dipropyleneglycol dibenzoate, diethylene glycol dibenzoate, polypropyleneglycol dibenzoate, and polyethylene glycol dibenzoate.

Plasticizer D), if used, is used at levels of between about 1 and about 10 wt % relative to total weight of A) plus B), typically at between about 2 and about 6 wt %.

Processing of the photoimageable composition is in a conventional manner. In a typical procedure, a photoimageable composition layer, either formed from a liquid composition or transferred as a layer from a dry film, is applied to a copper surface of a copper-clad board. The photoimageable composition layer is exposed to actinic radiation through appropriate artwork. Exposure to actinic radiation polymerizes the monomer in the light-exposed areas, resulting in a cross-linked structure that is resistant to developer. Next, the composition is developed in dilute aLkaline aqueous solution, such as a 1 % sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper.

The invention will now be described in greater detail by way of specific example.

Example
A photoimageable is prepared having the following components:

| Component | Wt % | Function |
|---|---|---|
| Binder A' | 12.49 | Low Molecular weight Binder* |
| Binder A" | 38.89 | Low $T_g$ binder** |
| Urethane acrylate | 15.37 | Photopolymerizable oligomer |
| Bis A ethoxylate dimethacrylate | 13.67 | Photopolymerizable oligomer |
| Propylene oxide, mono methacrylate | 10.80 | Photopolymerizable monomer |
| Michler's ethyl ketone | 0.05 | UV absorber |
| Lophine dimer (bis-chlorimidazole) | 3.50 | Color activator/photoinitiator |
| Leuco crystal violet | 0.40 | Color formor |
| Malichite green | 0.05 | Dye |
| Paratoluene sulfonamide | 4.48 | Platicizer |
| 9-phenyl acridine | 0.12 | Photoinitiator |
| Triphenylphosphine | 0.05 | Photo accelerator |
| n-phenyl glycine | 0.03 | Photoinitiator |
| o-phthalic acid | 0.06 | Anti-oxidizer |
| Modaflow ® | 0.10 | Flow control agent |

*Mw = 20,000; $T_g$ = 95; Acid No. = 239.
**Mw = 80,000; $T_g$ = 90; Acid No. = 149.

The composition was prepared in 7:1 2-Butanone:2-Propanol at approximately 50% solids. The solutions was coated onto biaxially oriented 80 gauge polyester film and dried to approximately 1% or less retained solvent. The coated mixture was then laminated onto mechanically scrubbed 1 oz./FR-4/1 oz. clad copper composite using a hot roll laminator at 110° C. at 2 meters/minute and 3 bar pressure.

The laminated material was then imaged on a UV printer through an appropriate phototool with an adjusted exposure to obtain a copper step of 7 as measured with a Stouffer® 21 step wedge (approximately 20 mJ/cm$^2$). The exposed panels were then developed in a 1% sodium carbonate monohydrate solution at 29° C. using a conveyorized spray developer at about 26 psi with residence time adjusted so that the break point occurred at 40% to 50% of the chamber length (unless otherwise noted in the specific example), followed by several spray rinses using tap water and the deionized water.

Etching was accomplished using a 2N cupric chloride/hydrochloric acid solution at 48° C. in a conveyorized etcher equipped with multiple spray nozzles. The etched board was then stripped of the imaged, developed and etched photo resist in a 3% sodium hydroxide solution at 54° C. in a conveyorized stripping unit equipped with mutiple spray nozzles followed by a spray rinse of tap water.

Process responses for the examples are cited at various points throughout the above procedure. Results are shown below:

| | |
|---|---|
| Thickness | 38 μm |
| Photospeed | |
| ST-6 | 27 mJ |
| ST-7 | 40 mJ |
| ST-8 | 55 mJ |
| ST-9 | 68 mJ |
| Resist Stripping (3% NaOH 50° C., 1.5 Kg/cm$^2$) | 34–39 sec. |
| Resolution (with equal line and space at 2× breakpoint) | 30 μm |
| Adhesion (with 400 μm space at 2× breakpoint) | 25 μm |
| Tent Strength at 20° C. | 4.5 mm |
| | 415 g. |

What is claimed is:

1. A photoimageable composition comprising
   A) between about 30 and about 70 wt %, based on total weight of A) plus
   B), of a organic binder polymers having sufficient acid functionality to render said photoimageable composition developable in alkaine aqueous solution,
      A) comprising between about 3 and about 65 wt % relative to total of A) plus B) a binder polymer A') having a weight average molecular weight between about 5000 and about 40,000 and $T_g$ of between about 40 and about 100, and between about 5 to about 67 wt % relative to total of A) plus B) a binder polymer A") having a weight average molecular weight between about 41,000 and about 200,000 and a $T_g$ of between about 40 and about 100,
   B) between about 30 and about 60 wt %, based on total weight of A) plus B), of α,β-ethylenically unsaturated compounds, said component B) comprising
      B') an isocyanate trimaer having tri-α,β-ethylenically unsaturated functionalty, said trimer B') being present at between about 2 to about 30 wt % based on total weight of A) plus B), and B") 0 to about 5 wt % based on total weight of A) plus B) of other α,β-ethylenically unsaturated compounds, at least about 50 mole percent of the α,β-ethylenically unsaturated functionality of B' and B" being methacrylate functionality and
   C) between about 0.5 and about 15 wt %, based on total weight of A) plus B) of an organic, radiation-sensitive free-radical generating system, said photoinitiator chemical system C) comprising between about 0.005 and about 3 wt % relative to total weight of A) plus B) of triphenyphosphine and between about 0.005 and about 2 wt % relative to total weight of A) plus B) of n-phenylglycine.

2. The photoimageable composition according to claim 1 further comprising D) between about 1 and about 10 wt % relative to weight of A) plus B) of plasticizer.

3. The photoimageable composition according to claim 2 wherein said plasticizer D) comprises paratoluensulfonamide.

4. The photoimageable composition according to claim 1 wherein said free-radical generating system C) further comprises 9-phenyl acridine at between about 0.05 and about 0.5 wt % relative to weight of A) plus B).

5. The photoimageable composition according to claim 1 further comprising E) between about 0.5 and about 10 wt % of a lophine dimer based on total weight of A) plus B) plus F) between about 0.5 and about 2.0 wt % of a Leuco dye based on total weight of A) plus B).

6. The photoimageable composition according to claim 1 wherein said binder polymer A') has a weight average molecular weight between about 10,000 and about 30,000.

7. The photoimageable composition according to claim 1 wherein said binder polymer A") has a weight average molecular weight between about 60,000 and about 120,000.

\* \* \* \* \*